(12) United States Patent
Thienot et al.

(10) Patent No.: US 7,571,152 B2
(45) Date of Patent: Aug. 4, 2009

(54) METHOD FOR COMPRESSING AND DECOMPRESSING STRUCTURED DOCUMENTS

(75) Inventors: Cédric Thienot, Paris (FR); Gwenael Durand, Paris (FR)

(73) Assignee: EXPWAY, Reims (FR)

( * ) Notice: Subject to any disclaimer, the term of this patent is extended or adjusted under 35 U.S.C. 154(b) by 143 days.

(21) Appl. No.: 11/381,768

(22) Filed: May 5, 2006

(65) Prior Publication Data

US 2006/0259167 A1 Nov. 16, 2006

Related U.S. Application Data

(63) Continuation of application No. PCT/EP2004/012627, filed on Nov. 8, 2004.

(60) Provisional application No. 60/517,886, filed on Nov. 7, 2003.

(51) Int. Cl.
- G06F 7/00 (2006.01)
- G06F 17/30 (2006.01)
- G06F 17/00 (2006.01)

(52) U.S. Cl. .......................... 707/1; 707/100
(58) Field of Classification Search ...................... 707/1, 707/100; 715/513
See application file for complete search history.

(56) References Cited

U.S. PATENT DOCUMENTS

| | | | |
|---|---|---|---|
| 5,933,842 A | | 8/1999 | Ross |
| 6,883,137 B1 * | | 4/2005 | Girardot et al. ............ 715/242 |
| 2002/0126666 A1 * | | 9/2002 | Rising et al. ............... 370/389 |
| 2002/0138517 A1 * | | 9/2002 | Mory et al. ................. 707/513 |
| 2004/0028049 A1 * | | 2/2004 | Wan ........................... 370/394 |
| 2005/0182778 A1 * | | 8/2005 | Heuer et al. ................ 707/101 |

FOREIGN PATENT DOCUMENTS

| WO | 02/063775 A2 | 8/2002 |
|---|---|---|
| WO | 02/063776 A2 | 8/2002 |

OTHER PUBLICATIONS

Liefke, H., et al.: "XMill: an Efficient Compressor for XML Data", ACM Proceedings of Sigmod. International Conference On Management Of Data, XX, XX, vol. 29, No. 2, May 16, 2000, pp. 153-164, XP002168802.
Expway: "Bin-XML for encoding XML documents URL—http://www.expway.tv DWWW-2002-12-16" www.expway.tv, 2002, pp. 1-5, XP002225539, Paris, France.
Intelligent Compression Technologies: "ICT'S XML-Xpress", ictcompress.com, Dec. 2000, XP002179806.

* cited by examiner

*Primary Examiner*—Mohammad Ali
*Assistant Examiner*—Alexey Shmatov
(74) *Attorney, Agent, or Firm*—Panitch Schwarze Belisario & Nadel LLP

(57) ABSTRACT

A method for encoding a group of several structured fragments includes analyzing structure schemas of the fragments in order to obtain sequences of executable instructions for each component of the schemas. The instruction sequences are executed on the structured fragments so as to obtain an encoded binary stream containing the control codes and the information elements values of the fragments. The values of the information elements of the fragments in data blocks are distributed as a function of the respective types of the elements. The respective positions in the structure block are stored in a pointer table for each fragment and in the data blocks of the control codes and the information element values of the fragment. Compression algorithms are applied to the blocks adapted to the contents thereof, and the contents of the pointer table and data blocks are concatenated into an encoded binary container.

22 Claims, 4 Drawing Sheets

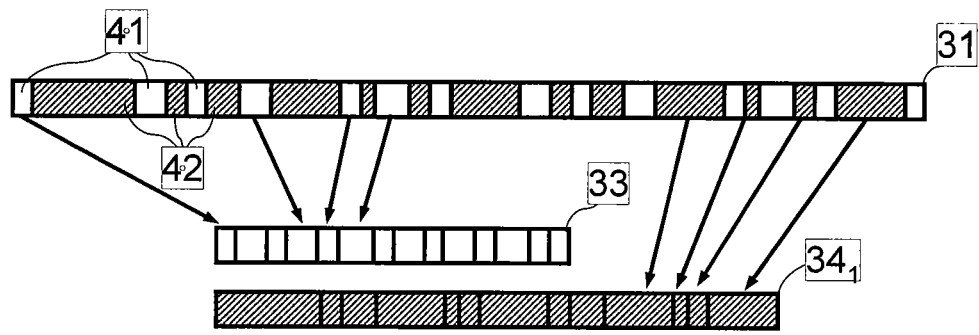
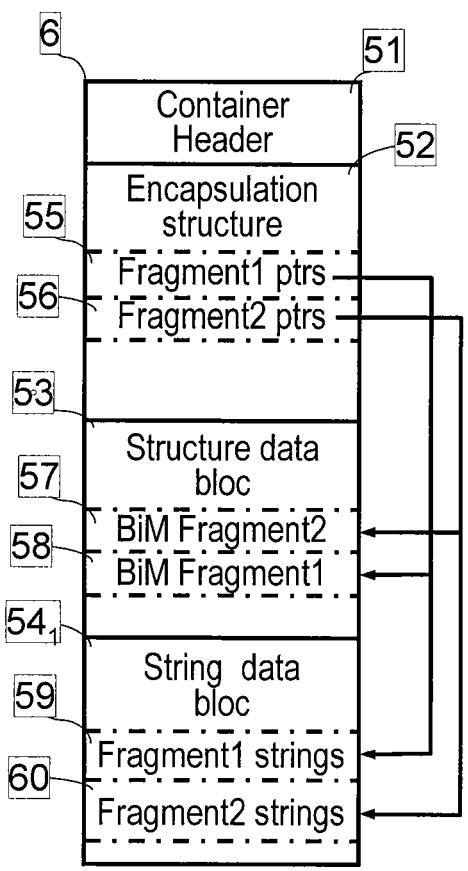
Fig. 3
Fig. 4
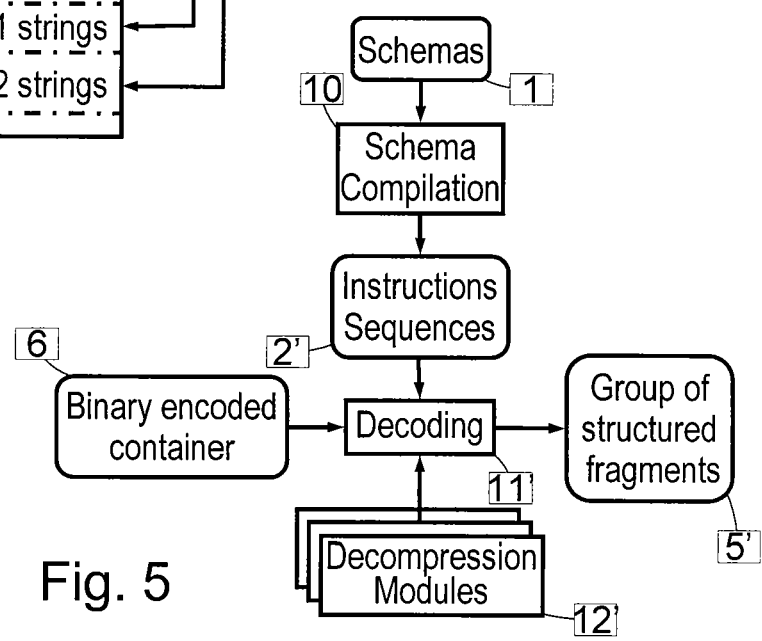
Fig. 5

METHOD FOR COMPRESSING AND DECOMPRESSING STRUCTURED DOCUMENTS

CROSS-REFERENCE TO RELATED APPLICATIONS

This application is a continuation of International Application No. PCT/EP2004/012627, filed Nov. 8, 2004, which was published in the English language on May 19, 2005, under International Publication No. WO 2005/046059 A1, and the disclosure of which is incorporated herein by reference. This application claims the benefit of U.S. Provisional Patent Application No. 60/517,886, filed Nov. 7, 2003.

BACKGROUND OF THE INVENTION

The invention relates in general to the field of computer systems, and more particularly to a method and system for the compression of structured documents using document descriptions that conforms to a generalized markup language, such as SGML (Standard Generalized Markup Language) and XML (Extensible Markup Language). The invention applies more particularly to metadata describing digital video programs and to mobile services.

In a few years, computer networks became the main media for communications. Now, computers can be plugged to a shared network, operating systems allow applications to easily exchange messages, Internet infrastructure allows computers to find their interlocutor, applications use complex algorithms to synchronize themselves.

In such a context of interoperability, generalized markup languages provides solutions to deal with document processing. Indeed, the structure of a document plays a main role in the document usage. Formatting, printing or indexing a document is essentially made in accordance with its structure. SGML was initially made to easily dissociate document presentation and document structure and content. Because of its ability to encode structures, XML attracted attention from different communities interested in non-document applications. XML audience widened to include (among others) electronic commerce, databases and knowledge representation communities.

XML and more generally markup languages are now widely used to describe and structure documents (metadata). A structured document comprises several information elements which may be nested in each other in a tree-like structure. The information elements are identified and separated from each other by tags, which identify the element types of the information elements. A structured document generally comprises a first information element or base element which represents the entire document and which is identified by tags marking the start and end of the document. This first element comprises information sub-elements, for instance paragraphs of text, each information sub-element being identified by tags marking the start and end of the element. Tags may be associated with tag attributes that specifies one or more characteristics of the information element.

Tag content represents information that is generally intended to be displayed or manipulated by a user. Tag content may be optional or required according to the type of tag, and may contain other nested information sub-elements which in turn are delimited by tags and have content and attributes.

A structured document may be associated with a schema which reflects the rules that the structured document should verify in order to be considered as "valid". It also contains information about default values, and defining element and attributes types and type hierarchies. Validity ensures that a received document is conformant to the schema and thus has the intended meaning. Moreover it determines what is the nature, i.e., the type of each description item (information element or attributes). XML standard includes an XML Schema Language which is designed to specify a grammar for a class of XML documents having similar structures. Each element type and attribute has a respective name which belongs to an XML namespace.

However XML is a verbose language and thus it is inefficient to be processed and costly to be transmitted. For this reason, ISO/IEC 15938-1 and more particularly MPEG-7 (Moving Picture Expert Group) proposes a method and a binary format for encoding (compressing) the description of a structured document and decoding such a binary format. This standard is more particularly designed to deal with highly structured data, such as multimedia metadata.

As disclosed in U.S. Patent Application Nos. 2004/0013307 and 2004/0054692 filed by the Applicant, the contents of which are incorporated by reference herein, this method relies upon a schema analysis phase so that compression efficiency can be obtained. During this phase, internal tables are computed to associate a binary code to each XML elements, types and attributes. This method mandates the full knowledge of the same schema by an encoder and a corresponding decoder.

In some applications such as digital video broadcast, metadata are transmitted in the video stream in the form of container grouping together data fragments which are likely to have a rather small size. This implies a limited redundancy notably over the string data, and therefore the string compression algorithms exploiting string redundancy, such as ZLIB, are not as efficient as expected in some cases.

BRIEF SUMMARY OF THE INVENTION

Embodiments of the present invention improve compression efficiency when the documents also called fragments are grouped together in so-called containers.

According to an embodiment of the invention, an encoding method is provided for encoding a group of at least two structured fragments each comprising information elements nested in each other and each associated with an information type or sub-type, each structured fragment being associated with at least one structure schema defining a document tree-like structure and comprising structure components nested in each other, each type or sub-type of information element in a fragment being defined by a component in one of the schemas. The encoding method includes analyzing the structure schemas in order to obtain sequences of executable instructions for each component of the structure schemas, comprising instructions for inserting into a bit stream control codes representing the structure of the fragments and values of information elements or component instruction sequence call codes, and instructions for controlling the execution of the sequence as a function of the control codes, and executing the instruction sequences on the structured fragments of the group so as to obtain an encoded binary container containing the control codes values and the information elements values of the fragments.

According to an embodiment the invention, this method further includes inserting the control codes of the fragments into a structure block; distributing the values of the information elements of all the fragments, having predefined information element types or sub-types in at least one data block as a function of the respective element types of the information elements, each data block corresponding to a respective set of element types or sub-types; storing in a pointer table for each fragment, the respective positions in the structure block and in the data blocks of the control codes and the information element values of the fragment; applying to the data blocks compression algorithms adapted to the contents thereof; and concatenating into an encoded container binary stream the respective contents of the pointer table, the structure block and the data blocks.

According to a preferred embodiment of the invention, the respective contents of the pointer table and the structure block are compressed by a suitable compression algorithm before being inserted into the encoded container binary stream.

According to a preferred embodiment of the invention, at least two of element of the set comprising the pointer table, the structure block and the data blocks are compressed together before being inserted into the encoded container binary stream.

According to a preferred embodiment of the invention, one of the data blocks contains all the string data of the fragments of the group having a sub-type belonging to a predefined set of string sub-types, the string data block being compressed together with the pointer table and the structure block before being inserted into the encoded container binary stream.

According to a preferred embodiment of the invention, the compression algorithm applied to the contents of the pointer table, the structure block and the string data block of the group is ZLIB.

According to a preferred embodiment of the invention, offset values in the data blocks of a skippable set of consecutive elements in a fragment of the group are inserted into the structure block, for each information element following the end of the set of skippable elements.

The invention further concerns a decoding method for decoding a binary encoded container grouping together at least two structured fragments each comprising information elements nested in each other and each associated with an information type or sub-type, each structured fragment being associated with at least one structure schema defining a document tree-like structure and comprising structure components nested in each other, each type or sub-type of information element in a fragment being defined by a component in one of the schemas, the decoding method comprising steps of analyzing the structure schemas in order to obtain sequences of executable instructions for each component of the structure schemas, comprising instructions for reading control codes in the binary encoded container, values of information elements or call codes to component instruction sequences, and instructions for controlling the execution of the sequence as a function of the control codes, executing the instruction sequences on the binary encoded container so as to restore each fragment of the group having a structure at least equivalent to that of an original group of fragments.

According to the invention, the binary encoded container comprises a structure block containing the control codes of all the fragments, at least one data block containing the values of information elements of all the fragments, having an element type or sub-type belonging to a same predefined set of types or sub-types, and a pointer table containing for each fragment the respective positions in the structure block and in the data blocks of the control codes and the information element values of the fragment, the decoding method further comprising steps of reading the pointer table and the structure and data blocks, and assembling the data in the structure and data blocks using the pointer table so as to form fragments constituting the restored group of fragments.

According to a preferred embodiment of the invention, the encoding method farther comprising a step of applying to at least the pointer table or the structure block or one of the data blocks a suitable decompression algorithm.

According to a preferred embodiment of the invention, one of the data blocks contains all the string data of the fragments of the binary encoded container, having a string sub-type belonging to a predefined set of string sub-types, the string data block being decompressed together with the pointer table and the structure block before reading the pointer table.

According to a preferred embodiment of the invention, the decompression algorithm applied to the contents of the pointer table, the structure block and the data block containing all the string data of the binary encoded container is ZLIB.

According to a preferred embodiment of the invention, the structure block comprises offset values in the data blocks of a skippable set of consecutive elements in a fragment of the binary encoded container, following the end of the set of skippable elements in the structure block, the decoding method further comprising a step of reading the offsets and using them to re-synchronize reading of data blocks at appropriate locations.

The invention will be more clearly understood and other features and advantages of the invention will emerge from a reading of the following description given with reference to the appended drawings.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIG. 3 schematically shows a section of an encoded binary stream and the way it is processed by the encoder illustrated in FIG. 1;

FIG. 4 schematically shows a binary encoded container produced by the encoder illustrated in FIG. 1;

FIG. 5 schematically illustrates a decoder according to the invention;

DETAILED DESCRIPTION OF THE INVENTION

Figure 1:
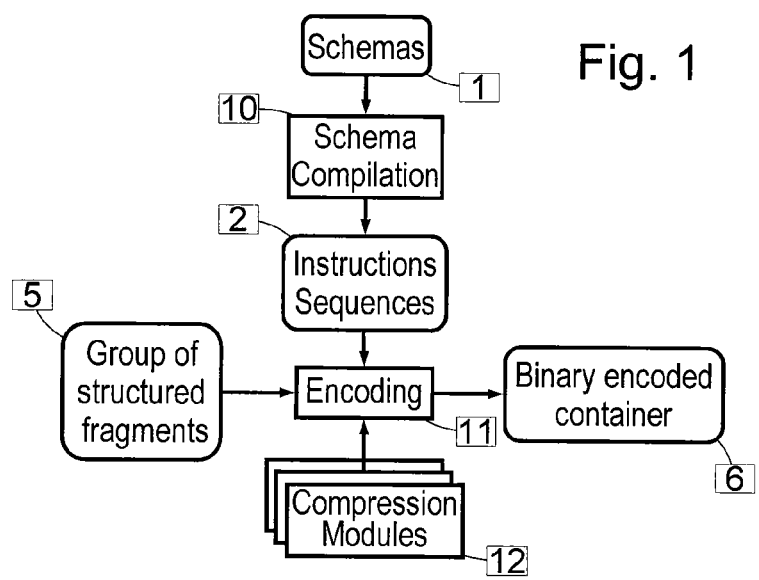
FIG. 1 schematically illustrates an encoder according to the invention.

The major characteristics of the invention will now be detailed. The compression method according to the invention as illustrated by FIG. 1 is designed to handle a group 5 of structured documents or fragments, each fragment being associated with a structure schema 1 defining the fragment structure. Such fragments are for example structured metadata of a video program which are embedded into a video stream.

At a compilation phase 10 of this method, the schemas of the fragments in the group of fragments are compiled according to the method disclosed in U.S. Patent Application No. 2004/0054692, the contents of which are incorporated by reference herein, so as to obtain executable instructions sequences 2 for each component of the structure schemas. These instruction sequences for each component of the structure schemas comprise instructions for inserting control codes and values of information elements or component instruction sequences call codes, and instructions for controlling the execution of the sequence as a function of control code values.

The compilation of the structure schemas include a step of normalization, so as to obtain a single predefined order of components in the schema, and a step of optimizing and simplifying consisting in reducing the number of nesting levels in structure components of the schemas.

At a next encoding phase 11, the instruction sequences 2 are executed on the structured fragments in the group 5 in order to obtain a binary stream containing the compressed structure information within the fragments of the group 5, interleaved with values of the basic information elements (which are not decomposed into sub-elements). Before being inserted in the binary stream, at least some values of the basic information elements are processed by respective compression algorithms 12 adapted to the information types of the basic information elements. The encoding phase transforms the group 5 into a binary encoded container 6 having a reduced size.

Figure 2:
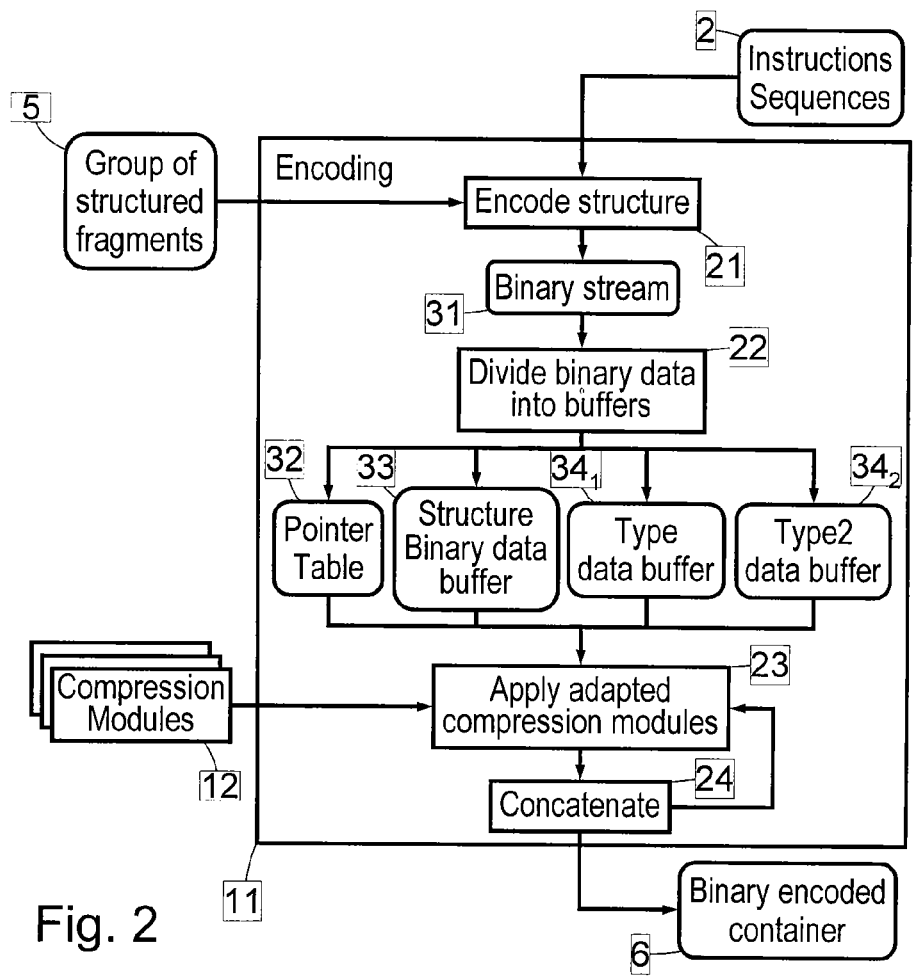
FIG. 2 is a more detailed view of the encoder shown in FIG. 1.

The encoding phase 11 is detailed in FIG. 2. In this Fig., the binary sequences 2 are first executed at step 21 on the fragments of the group 5 so as to obtain a binary stream 31 comprising the document structure in the form of binary data interleaved with the values of the basic information elements contained in the fragments. At the next step 22, the binary stream 31 is read and distributed in several buffers, namely a first buffer 33 receiving the binary structure sequences, and several buffers $34_1, 34_2, \ldots (34_i)$ in which the values of the basic information elements are distributed as a function of their respective information element type or sub-type, each buffer $34_i$ receiving data having an information element type belonging to a respective predefined set of types or sub-types defined in the structure schemas 1 of the fragments in the group 5. FIG. 3 shows a binary stream 31 containing binary structure data 41 (white areas) interleaved with data 42 (hatched areas) of another type, for example string type. During the distribution process, the binary structure data are inserted into the buffer 33 and the data 42 are inserted into the buffer $34_1$.

During this distribution process, a set of pointers for each fragment is memorized in a pointer table 32, each pointer set comprising a pointer referencing respectively a memory location in each buffer 33, $34_1, 34_2, \ldots$ from where the data of the fragment are stored. Each pointer corresponds to the zero-based offset in bytes of the first memory location of the fragment data from the start of the buffer.

Obviously, steps 21 and 22 can also be performed at the same time without generating a binary stream, the data being distributed in the buffers 33, $34_i$ as instruction sequences are executed.

At the next step 23, a respective compression algorithm 12 is applied to the content of the pointer table 32 and each buffer 33, $34_i$, these compression algorithms being chosen as a function of the type of data contained in the table and the buffers. Table 32, binary data buffer 33 and buffer $34_1$ containing strings are advantageously compressed together by ZLIB algorithm. Steps 23 and 24 can be performed in any order and/or partially several times. The selection of the compression modules to be executed and/or selection of compression parameters can also be determined as a function of parameters extracted during step 21.

The compressed contents of table 32, binary data buffer 33 and buffers $34_i$ are concatenated at the next step 24 into an encoded binary stream, and a container header is added at the beginning of the encoded binary stream so as to obtain the binary encoded container 6 shown in FIG. 4 comprising a container header 51, an encapsulation structure 52 including the compressed content of table 32, a structure data block 53 including the compressed content of buffer 33, and several data blocks including respectively the compressed content of buffers $34_i$. In the example of FIG. 4, the encoded container 6 comprises a string data block $54_1$ including the compressed content of buffer $34_1$. The encapsulation structure 52 comprises respective pointers 55 and 56 re of a first fragment and second fragments. The pointers 55 comprise a pointer to the structure data 57 of the first fragment in the structure data block 53 and a pointer to the string data 59 of this fragment in the string data block $54_1$. In a same manner, the pointers 56 comprise a pointer to the structure data 58 of the second fragment in the structure data block 53 and a pointer to the string data 60 of this fragment in the string data block $54_1$. The container header 51 comprises pointers to the main parts of the encoded container 6, so as to locate in the encoded container 6 the encapsulation structure 52, and the data blocks 53, $54_i$.

FIG. 5 illustrates the decompression method according to the invention. This method comprises a decoding phase 11' during which instruction sequences 2' and decompression algorithms 12' are executed on the binary encoded container 6 so as to obtain a decoded group of fragments 5'. The instruction sequences 2' are obtained in a same manner from the structure schemas of the fragments contained in the encoded container 6, and correspond to those executed in the encoding method of FIG. 1, in which insertion instructions are replaced by reading instructions.

Figure 6:
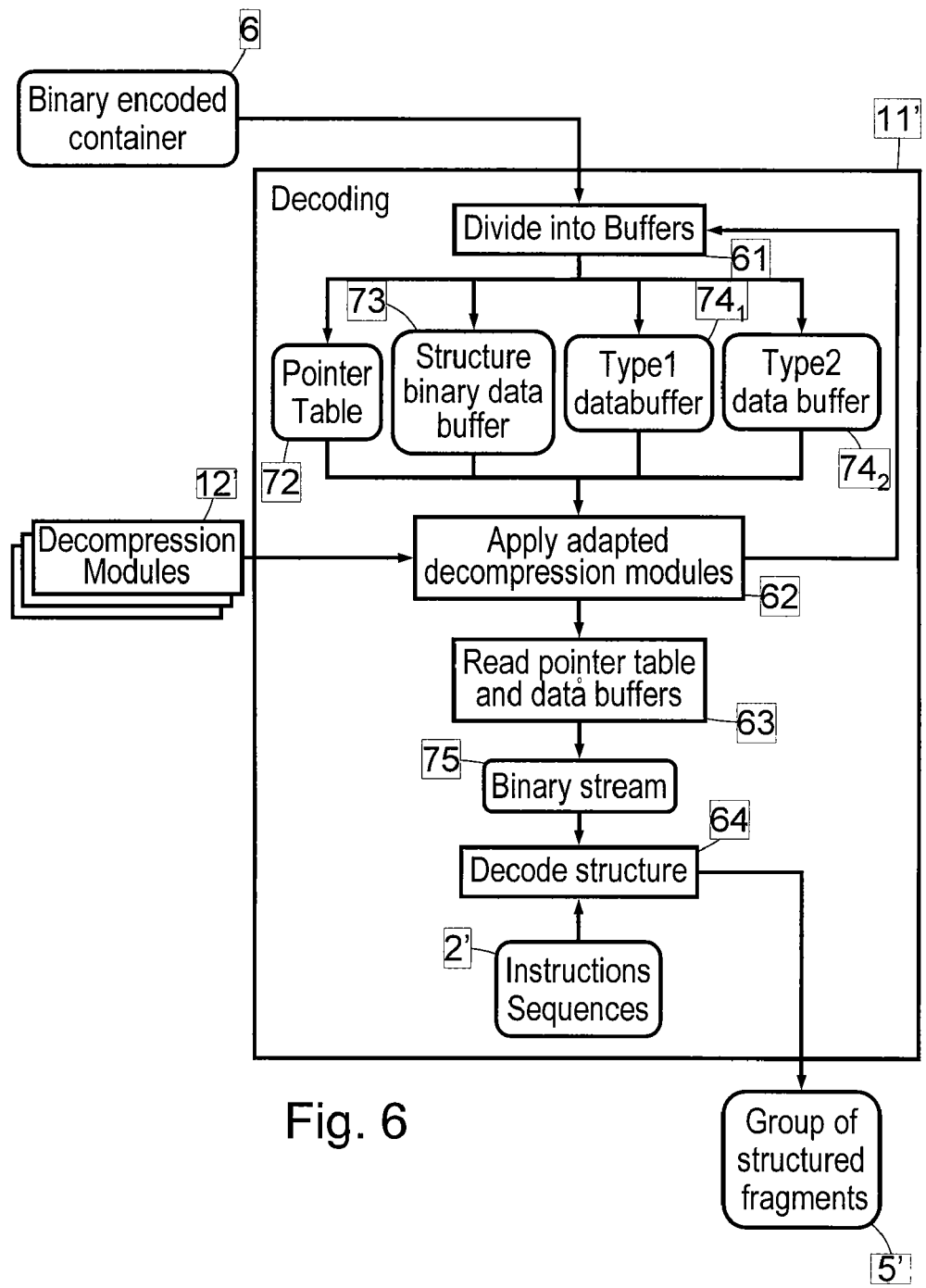
FIG. 6 is a more detailed view of the decoder shown in FIG. 5.

As detailed in FIG. 6, the decoding phase 11' comprises a step 61 during which the encoded container 6 is read and the parts 52, 53 and $54_i$ are distributed respectively in a pointer table 72, a structure binary data buffer 73 and data buffers $74_1, 74_2, \ldots (74_i)$ of data of the same type, using information in the container header 51. At the next step 62, the binary streams contained in table 72 and buffers 73, $74_i$ are decompressed using the appropriate decompression algorithm 12'. Steps 61 and 62 can also be performed simultaneously, the decompression algorithms being applied to the encoded container as the latter is read and the result of decompression being distributed in the table 72 and buffers 73, $74_i$. Steps 61 and 62 can also be performed in any order and/or partially several times.

At the next step 63, the pointer table 72 and the buffers 73, $74_i$ are read so as to reassemble the binary stream 75 containing each fragment of the container. Thereafter, the binary stream binary structure data contained in the binary stream 75 are decoded using the instruction sequences 2' generated from the schemas 1 of the fragments so as to obtain a decoded group of fragments 5' (step 64). Of course steps 63 and 64 can be also mixed: the content of structure data buffer 73 is decoded before being assembled into fragments with the data contained in the buffers $74_i$.

Thanks to these dispositions, the invention improves overall compression of such containers, since statistical compression algorithms can now take advantage of inter-fragment data redundancy. It further simplifies implementation of compression algorithms, better supports compatibility, since the compression algorithms are not used within the fragments, and significantly improves the compression of structure parts of the binary stream since bytes of fragments of the same type are now aligned. In addition string searches within containers can be easily performed without decoding containers.

Figure 7:
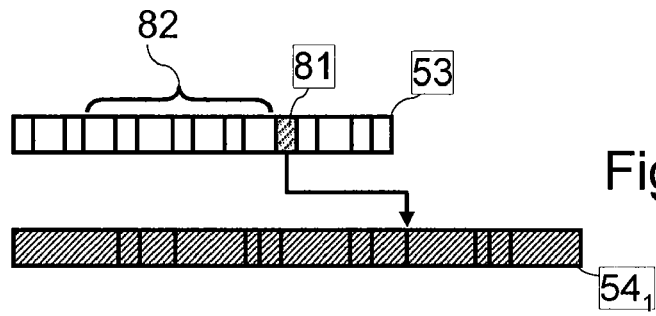
FIGS. 7 and 8 illustrate sections of a binary encoded container produced by the encoder illustrated in FIG. 1, when a data element of the container is skippable.
Figure 8:
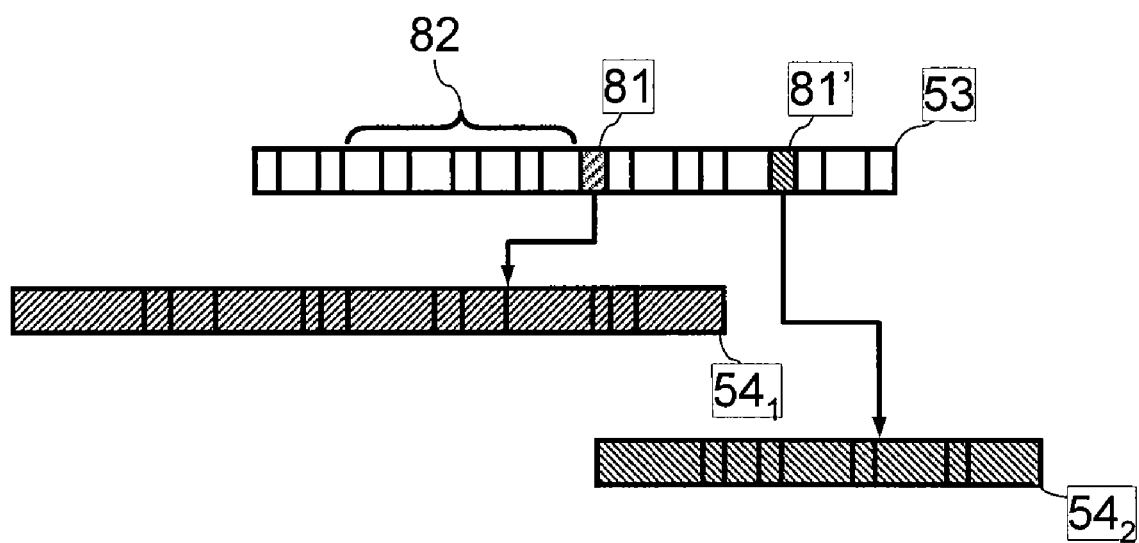

FIGS. 7 and 8 illustrate a mechanism supporting schema compatibility so as to enable a decoder which does not support a new version of a structure schema to skip unrecognized part of a binary encoded stream. More detailed information about schema compatibility is disclosed in U.S. Patent Application No. 2004/0068696, the contents of which are incorporated by reference herein. The distribution of the data into blocks 53, 54, addressed by pointer table in the encapsulation structure 52 makes it necessary to "re-synchronize" the pointers in each blocks 53, 54, after a chunk of the binary stream is skipped. According to a feature of the invention, the offset values 81, 81' (from the respective beginnings of the blocks $54_i$) of a skippable chunk in the blocks $54_i$ is inserted into the structure binary data block 53, for each data following the end of a skippable element 82 immediately before the place in the structure block 53 where a data should be read in one of the blocks $54_i$. When decoding the binary stream 6, the decoder reads these offsets and uses them to re-synchronize the pointers at appropriate locations in the buffers $74_i$.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. An encoding method for encoding a group of at least two structured fragments, each comprising information elements nested in each other and each being associated with an information type or sub-type, each structured fragment being associated with at least one structure schema defining a document tree-like structure and comprising structure components nested in each other, each type or sub-type of information element in a fragment being defined by a component in one of the schemas, the encoding method comprising:
   compiling the structure schemas in order to obtain at least one sequence of executable instructions for each component of the structure schemas, said at least one executable instruction sequence comprising instructions for inserting into a bit stream, control codes representing the structure of the fragments, values of the information elements, instructions for calling an instruction sequence of a component, and instructions for controlling the execution of the sequence as a function of the control codes;
   executing the at least one executable instruction sequence on each of the structured fragments of the group so as to obtain an encoded binary stream containing the control codes values and the information elements values of the fragments;
   inserting the control codes of the fragments into a single structure block;
   distributing the values of the information elements of the fragments, having predefined information element types or sub-types in at least one data block as a function of the respective element types of the information elements, each at least one data block corresponding to a respective set of element types or sub-types, each at least one data block being distinct from the structure block;
   storing in a pointer table for each fragment, the respective positions of the control codes in the structure block and the positions of the information element values of the fragment in each of the at least one data blocks;
   applying to each of the data blocks a compression algorithm adapted to the types of data contained in the data block; and
   concatenating into a binary encoded container the respective contents of the pointer table, the single structure block and the data blocks.

2. The encoding method according to claim 1, wherein the respective contents of the pointer table and the structure block are compressed by a suitable compression algorithm before being inserted into the binary encoded container.

3. The encoding method according to claim 1, wherein at least two elements of the set comprising the pointer table, the structure block and the at least one data block are compressed together before being inserted into the binary encoded container.

4. The encoding method according to claim 1, wherein one of the at least one data blocks contains string data of the fragments of the group having a sub-type belonging to a predefined set of string sub-types, the string data block being compressed together with the pointer table and the structure block before being inserted into the binary encoded container.

5. The encoding method according to claim 4, wherein the compression algorithm applied to the contents of the pointer table, the structure block and the string data block of the group is ZLIB.

6. The encoding method according to claim 1, wherein offset values in the data blocks of a skippable set of consecutive elements in a fragment of the group are inserted into the structure block, for each information element following the end of the set of skippable elements.

7. A decoding method for decoding a binary encoded container obtained by the encoding method of claim 1 comprising the steps of:
   reading the binary encoded container to obtain the pointer table, the control codes and the at least one data block;
   reading the pointer table, the single structure block and the at least one data block to assemble a binary stream containing each fragment of the binary encoded container;
   compiling each structure schema in order to obtain at least one sequence of executable instructions for each structure component of the structure schemas, said at least one executable instruction sequence comprising instructions for reading control codes in the binary encoded container, values of the information elements, instructions for calling an instruction sequence of a component and instructions for controlling the execution of the sequence as a function of the control codes; and
   executing the at least one executable instruction sequence on the binary stream so as to obtain a group of structured fragments having a structure at least equivalent to that of the group of fragments.

8. The decoding method according to claim 7, further comprising: applying to at least one of the pointer table, the structure block and the at least one data block a suitable decompression algorithm.

9. The decoding method according to claim 7, wherein one of the data blocks contains string data of the fragments of the binary encoded container, the string data block having a string sub-type belonging to a predefined set of string sub-types, the string data block being decompressed together with the pointer table and the structure block before reading the pointer table.

10. The decoding method according to claim 9, wherein the decompression algorithm applied to the contents of the pointer table, the structure block and the data block containing all the string data of the binary encoded container is ZLIB.

11. The decoding method according to claim 7, wherein the structure block comprises offset values in the at least one data block of a skippable set of consecutive elements in a fragment of the binary encoded container, following the end of the set of skippable elements in the structure block, the decoding method further comprising a step of reading the offsets and using them to re-synchronize reading of the at least one data block at appropriate locations.

12. An encoding method for encoding a structured fragment comprising information elements nested in each other and each associated with an information type or sub-type, the structured fragment being associated with at least one structure schema defining a document tree-like structure and comprising structure components nested in each other, each type or sub-type of information element in the fragment being defined by the structure component in the schema, the encoding method comprising:

compiling the structure schema in order to obtain at least one sequence of executable instructions for each structure component of the structure schema, said at least one executable instruction sequence comprising instructions for inserting into a bit stream control codes representing the structure of the fragment and values of the information elements, instructions for calling an instruction sequence of a structure component and instructions for controlling the execution of the sequence as a function of the control codes; and executing the at least one executable instruction sequence on the structured fragment of the group so as to obtain a binary stream containing the control codes values and the information elements values of the fragment;

inserting the control codes of the fragment into a single structure block;

distributing the values of the information elements of the fragment, having predefined information element types or sub-types, in at least one data block distinct from the structure block as a function of the respective element types of the information elements, each data block corresponding to a respective set of element types or sub-types;

storing in a pointer table, the respective positions in the structure block and in the data blocks of the control codes and the information element values of the fragment;

applying to each of the data blocks a compression algorithm adapted to the types of the data contained in the data block; and concatenating into an a binary encoded container the respective contents of the pointer table, the single structure block and the data blocks.

13. The encoding method according to claim 12, wherein the respective contents of the pointer table and the structure block are compressed by a suitable compression algorithm before being inserted into the binary encoded container.

14. The encoding method according to claim 12, wherein at least two of element of the set comprising the pointer table, the structure block and the data blocks are compressed together before being inserted into the binary encoded container.

15. The encoding method according to claim 12, wherein one of the data blocks contains string data of the fragment of the group having a sub-type belonging to a predefined set of string sub-types, the string data block being compressed together with the pointer table and the structure block before being inserted into the binary encoded container.

16. The encoding method according to claim 15, wherein the compression algorithm applied to the contents of the pointer table, the structure block and the string data block of the group is ZLIB.

17. The encoding method according to claim 12, wherein offset values in the at least one data block of a skippable set of consecutive elements in the fragment of the group are inserted into the structure block, for each information element following the end of the set of skippable elements.

18. A decoding method for decoding a binary encoded container obtained by the encoding method of claim 12 comprising the steps of:

reading the binary encoded container to obtain the pointer table, the control codes and the at least one data block;

reading the pointer table, the single structure block and the at least one data block to assemble a binary stream containing the fragment of the binary encoded container;

compiling each structure schema in order to obtain at least one sequence of executable instructions for each structure component of the structure schemas, said at least one executable instruction sequence comprising instructions for reading control codes in the binary encoded container, values of the information elements, instructions for calling an instruction sequence of a component and instructions for controlling the execution of the sequence as a function of the control codes; and executing the at least one executable instruction sequence on the binary stream so as to obtain a fragments having a structure at least equivalent to that of the fragment.

19. The decoding method according to claim 18, further comprising a step of applying to at least one of the pointer table, the structure block and the at least one data block a suitable decompression algorithm.

20. The decoding method according to claim 18, wherein one of the at least one data blocks contains all the string data of the fragment of the binary encoded container, having a string sub-type belonging to a predefined set of string sub-types, the string data block being decompressed together with the pointer table and the structure block before reading the pointer table.

21. The decoding method according to claim 20, wherein the decompression algorithm applied to the contents of the pointer table, the structure block and the data block containing all the string data of the binary encoded container is ZLIB.

22. The decoding method according to claim 18, wherein the structure block comprises offset values in the at least one data block of a skippable set of consecutive elements in the fragment of the binary encoded container following the end of the set of skippable elements in the structure block, the decoding method further comprising a step of reading the offsets and using them to re-synchronize reading of the at least one data block at appropriate locations.

* * * * *